SEMICONDUCTOR DEVICE IN THE ULTRA-LOW-TEMPERATURE STATE

Filed Sept. 23, 1964

INVENTOR.
Kiichi Komatsubara
Noboru Takesugi
BY
Mesbern & Mestern

United States Patent Office 3,293,567

Patented Dec. 20, 1966

3,293,567

SEMICONDUCTOR DEVICE IN THE ULTRA-LOW-TEMPERATURE STATE

Kiichi Komatsubara, Kodaira-shi, and Noboru Takasugi, Yamato-machi, Kitatama-gun, Tokyo-to, Japan, assignors to Kabushiki Kaisha Hitachi Seisakusho, Tokyo-to, Japan, a joint-stock company of Japan

Filed Sept. 23, 1964, Ser. No. 398,494

Claims priority, application Japan, Oct. 1, 1963, 38/51,941

1 Claim. (Cl. 331—107)

This invention relates to semiconductor devices in the low temperature state. More specifically, the invention relates to a new semiconductor device adapted to utilize effectively oscillation due to a standing wave of an electric field, said standing wave being formed in a direction perpendicular to a current passed through a semiconductor of a low temperature state when a magnetic field is applied to the semiconductor in a direction perpendicular to the current, and said oscillation having an operational effect similar to that of a magnetron.

It is known that a semiconductor device of a material such as highly compensated germanium or silicon exhibits a negative resistance characteristic in the low-temperature state (such a semiconductor device being hereinafter referred to as a "cryosar"), and that when this cryosar is used as a switching element, an extremely rapid switching speed corresponding to a switching time as short as $10^{-8}$ second or less can be attained.

The present inventors have previously disclosed in U.S. Patent Application Serial No. 266,289, now abandoned, that when a cryosar is subjected to irradiation by light, its negative resistance characteristic varies, that is, while the value of the critical voltage which gives rise to the negative resistance in the voltage-current characteristic generally decreases when illuminated by intense light, it does not necessarily decrease when the illuminating light is of extremely low intensity; rather, it increases under extremely low intensity light. Furthermore, the present inventors have disclosed that this increase in the critical voltage in the region of low intensity of the light is remarkably pronounced in the case where the cryosar is doped with a deep trap level.

The present inventors have further disclosed in U.S. Patent Application Serial No. 312,654 that when a magnetic field is applied to the above described cryosar, its negative resistance characteristic changes. That is, when a magnetic field is applied to a cryosar in a direction perpendicular or parallel to its current direction, the holding voltage $E_s$ of the cryosar increases approximately proportionately to the magnetic field strength, but the critical voltage $E_c$ undergoes a complex variation with increase in the magnetic field strength.

In the above mentioned application, the inventors have further disclosed that, when the strength of the applied magnetic field reaches or exceeds a certain value, it begins to impart a coherent oscillation and a further rise in the strength of the magnetic field causes a progressive improvement in the coherency of this oscillation and, at the same time, an increase in the oscillation frequency, and that this oscillation is sensitive to the crystal axis relative to the magnetic field direction, thus exhibiting a remarkable crystal anisotropy.

The present invention is based on the results of continuous research beginning with the above described findings. More specifically, the invention is based on the discovery that the above mentioned cryosar oscillation exhibits a mode very similar to that of a magnetron oscillation, that the entire cryosar functions as a kind of magnetron cavity, and that a standing wave of an electric field is generated in a direction perpendicular to that in which current is passed through the cryosar.

It has been found further from various experiments that that standing wave of an electric field within the cryosar can be extracted to the outside by means of a waveguide made by cutting a semiconductor structure into a suitable shape. Furthermore, it has been found that an oscillation of this character is exhibited also by a semiconductor which is not especially compensated. However, a higher compensation ratio results in a larger amplitude of the oscillation, which, moreover, takes place from a lower value of the mode number *n*.

In addition, it has been found that this oscillation is not limited to only semiconductors such as germanium and silicon, but is also generated in the case of samples of group III–V intermetallic compounds such as InSb and GaAs.

With the foregoing findings in view, it is a general object of the present invention to provide a semiconductor device adapted to utilize effectively the above described oscillation and having highly desirable characteristics.

The above stated object has been achieved by the present invention which, briefly stated, resides in a semiconductor device comprising at least first means to pass a direct current through a semiconductor element maintained at a low temperature, second means to apply a magnetic field to the semiconductor element in a direction substantially perpendicular to that of said current, and third means to extract, to the exterior of the semiconductor device, oscillation output generated therewithin by said first and second means.

In another aspect of the invention, it resides in a semiconductor device which comprises a semiconductor element maintained during operation in a state wherein it is maintained at a low temperature, a D.-C. current is passed therethrough in one direction, and a magnetic field is applied thereto in a direction perpendicular to the direction of the D.-C. current, whereby an electric field oscillation is generated within the semiconductor device, and comprises a semiconductor cubic bar whose one end is in conjunction with one side surface of the said device which surface is perpendicular to both the current direction and the applied magnetic field direction, whereby oscillating electric fields are propagated through said cubic bar is if electric waves are propagated through a metallic wave guide tube.

The nature, principle, and details of the invention will be more clearly apparent by reference to the following description when taken in conjunction with the accompanying drawing in which.

The aforementioned oscillation of a cryosar will be further considered. The oscillation frequency *f* may be generally expressed as follows:

$$f \propto \frac{H_t}{(N_m - N_o)^{1/2}} \left[ \left( \frac{n_1}{n_1} \right)^2 + \left( \frac{n_2}{L_t} \right)^2 \right]^{1/2} \left[ \left( \frac{n_2}{L_t} \right)^2 \right]^{1/2}$$

where: $H_t$ is the strength of a magnetic field applied in the longitudinal direction of the semiconductor device;

$N_m$ is the majority impurity concentration with the used semiconductor;

$N_c$ is the minority impurity concentration for compensating for the majority impurity concentration;

$L_l$ and $L_t$ are dimensions of the device in the directions, respectively, parallel and perpendicular to the applied magnetic field; and $n_1$ and $n_2$ are the numbers of the modes of the oscillation respectively in the $L_1$ and $L_t$ directions.

In the case where a sample with a right-angle cross section is used, the above equation can be written as follows:

$$f \propto \frac{H_t}{N_m^{1/2} L^2}$$

An oscillation of this character is similar to that generated by a cavity resonator in a magnetic field. Moreover, the propagation mechanisms of the oscillation waveforms are also similar, and similar mechanisms may be considered.

In this oscillation, a standing wave of an electric field is being generated perpendicularly to the direction of the current flowing through the sample. The number of modes $n$ of this standing wave is proportional to the strength of the applied magnetic field in the case where the current flowing through the sample is controlled at a constant value.

Figure 1:
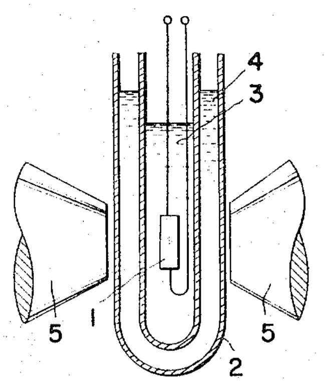
FIGURE 1 is a diagrammatic elevational view, partly in section, showing the essential parts of an apparatus for low temperatures used for an embodiment of the invention.

The foregoing results were obtained from example measurements made by means of the apparatus shown in FIGURE 1. The semiconductor device used was that made of germanium 1 of the form of a cubic bar of 5 x 2 x 2 mm. dimensions doped by indium of $1 \times 10^{15}$ atoms/cc. as majority impurity and compensated by antimony of $0.81 \times 10^{15}$ atoms/cc. The device 1 was placed in a low temperature apparatus 2 filled with liquid helium 3 and liquid nitrogen 4. Magnet poles 5 were set to apply a magnetic field to the semiconductor device 1.

Figure 2:
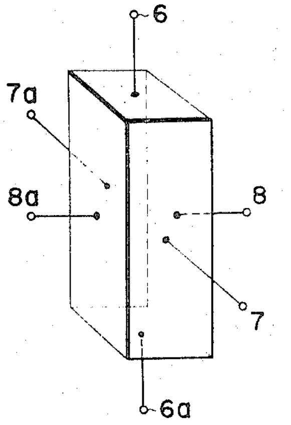
FIGURE 2 is an enlarged perspective view of a cryosar.
Figure 3:
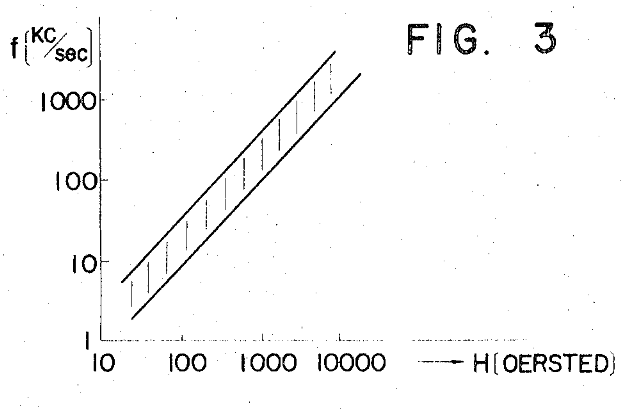
FIGURE 3 is a graphical representation indicating the relationship between magnetic field strength and oscillation frequency of a cryosar.

As shown in enlarged, perspective view in FIGURE 2, the device 1 was provided with current terminals 6, 7, 8 and $6_a$, $7_a$, $8_a$. A constant current was passed through the terminals 6 and $6_a$ of the device, and a variable magnetic field was applied in the direction parallel to the terminals 8 and $8_a$. The relationship between the strength of magnetic field applied parallel to the $7$–$7_a$ direction and the frequency of the oscillation produced are indicated in FIGURE 3.

It has been found that the oscillation output produced as described above can be propagated through a semiconductor cubic bar formed as a waveguide.

Figure 4:
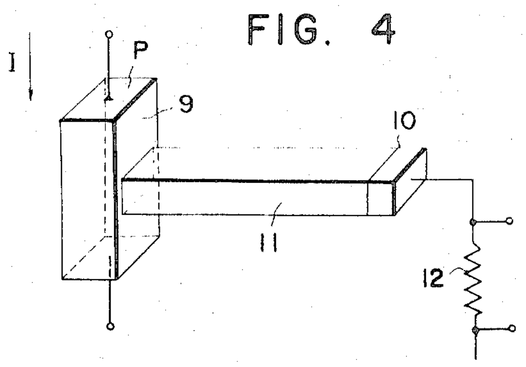
FIGURE 4 is an enlarged, schematic perspective view illustrating one embodiment of the invention.

This may be accomplished, for example, by the arrangement and construction of parts as indicated in FIGURE 4. As shown, a germanium semiconductor bar 11 having a p-n junction on its one end 10 as a detector is disposed with its other end in conjunction a side surface of a 5 x 3 x 3 mm. germanium cryosar 9. The end 10 of the bar 11 is connected to an oscillation detecting device 12. The entire semiconductor device is placed in liquid helium (not indicated).

The surfaces of the two semiconductor structures are polished up to an optical flat, and the mutually facing surfaces are caused to be optical parallel in order to reduce reflection loss. The reflection by interface between the semiconductor and liquid helium is, by its nature, accompanied by high reflection loss, and the value of Q in the case when the device is considered as a waveguide tube is small. However, in the case of a highly compensated semiconductor device, the amplitude of the oscillation is large, and, for example, when currents of from 1 to 3 ma. were passed through the cryosar 9, oscillation voltages of approximately from 2 to 4 millivolts were detected by the detecting device 12, in the case of using the semiconductor wave guide 11 of a length of 15 mm.

It has been found that, by further reducing the cryosar dimensions, it is possible with low power to propagate oscillating electric fields at frequencies of from a number of tens of kc./sec. to a number of tens of mc./sec.

As disclosed above with respect to specific embodiments of the invention, by the practice of the invention it is possible: to generate oscillation by maintaining a small semiconductor structure at a low temperature, passing a D.-C. current therethrough, and applying thereto a magnetic field in a direction perpendicular to that of the current; to obtain within a semiconductor a standing wave of an electric field by this oscillation similarly as in the case of a cavity of a waveguide tube; and to cause this oscillation to propagate by using a semiconductor structure as a waveguide, it being possible, moreover, to extract this oscillation to the outside.

Moreover, since the frequency becomes low in correspondence with the magnitude of the dielectric constant, extreme miniaturization can be achieved in comparison with ordinary metal waveguide tubes at the same frequency. Furthermore, with a relatively low power sample device of 3 mm. square cross section, for example, and with an input current of the order of 1 to 2 ma., it is possible to extract in the lateral direction a relatively high voltage of approximately 2 to 6 millivolts.

When the semiconductor device surfaces are polished to an extremely clean finish and etched to remove surface defects, and then caused to be optically parallel, the reflection loss due to the surfaces is low, and the Q value becomes high. However, it is difficult to avoid the loss at the interface between the semiconductor sample and the liquid helium for obtaining low temperatures.

Since the semiconductor device according to the invention operates at low temperatures, it can be used advantageously in coupled state with low temperature elements such as cryotrons and cryosars.

It should be understood, of course, that the foregoing disclosure relates to only preferred embodiments of the invention and that it is intended to cover all changes and modifications of the examples of the invention herein chosen for the purposes of the disclosure, which do not constitute departures from the spirit and scope of the invention as set forth in the appended claim.

What we claim is:

A semiconductor device which comprises a semiconductor device maintained during operation in a state wherein it is maintained at a low temperature, a D.-C. current is passed therethrough in one direction, and a magnetic field is applied thereto in a direction perpendicular to the direction of the D.-C. current, whereby an electric field oscillation is generated within the semiconductor device, and comprises a semiconductor structure one end surface of which is in conjunction with a side surface of the semiconductor device which surface is perpendicular to both the current direction and the applied magnetic field direction, whereby oscillating electric fields are propagated through the said semiconductor structure.

References Cited by the Examiner

UNITED STATES PATENTS

| | | | |
|---|---|---|---|
| 2,944,167 | 7/1960 | Matare | 307—88.5 |
| 2,988,707 | 6/1961 | Kuhrt et al. | 307—107 |
| 3,167,663 | 1/1965 | Melngailis et al. | 307—88.5 |

OTHER REFERENCES

Larrabee et al., Journal of Applied Physics, The Oscillator, vol. 31, No. 9, pages 1519–1523, September 1960.

ROY LAKE, *Primary Examiner.*

J. KOMINSKI, *Assistant Examiner.*